US008433975B2

(12) United States Patent
Hekstra et al.

(10) Patent No.: US 8,433,975 B2
(45) Date of Patent: Apr. 30, 2013

(54) BITWISE RELIABILITY INDICATORS FROM SURVIVOR BITS IN VITERBI DECODERS

(75) Inventors: Andries Pieter Hekstra, Eindhoven (NL); Nur Engin, Eindhoven (NL)

(73) Assignee: NXP B.V., Eindohoven (NL)

( * ) Notice: Subject to any disclaimer, the term of this patent is extended or adjusted under 35 U.S.C. 154(b) by 324 days.

(21) Appl. No.: 12/856,143

(22) Filed: Aug. 13, 2010

(65) Prior Publication Data

US 2012/0042228 A1    Feb. 16, 2012

(51) Int. Cl.
*H03M 13/00*    (2006.01)

(52) U.S. Cl.
USPC .......................................... 714/760

(58) Field of Classification Search ................... 714/795, 714/797
See application file for complete search history.

(56) References Cited

U.S. PATENT DOCUMENTS

| | | | |
|---|---|---|---|
| 5,272,706 A | 12/1993 | Park | |
| 5,942,003 A | 8/1999 | Ivry | |
| 5,996,103 A | 11/1999 | Jahanghir | |
| 6,081,919 A * | 6/2000 | Fujiwara et al. | 714/755 |
| 6,108,811 A | 8/2000 | Nakamura et al. | |
| 6,334,201 B1 * | 12/2001 | Sawaguchi et al. | 714/795 |
| 6,877,132 B1 * | 4/2005 | De et al. | 714/795 |
| 7,228,489 B1 | 6/2007 | Boyer | |
| 7,424,071 B2 * | 9/2008 | Allpress et al. | 375/343 |
| 8,009,773 B1 * | 8/2011 | Kankipati et al. | 375/341 |
| 2002/0174402 A1 * | 11/2002 | Yamamoto | 714/795 |
| 2003/0212950 A1 * | 11/2003 | Chen et al. | 714/795 |
| 2005/0262423 A1 * | 11/2005 | Liu et al. | 714/798 |
| 2007/0168847 A1 | 7/2007 | Pisek et al. | |
| 2009/0070658 A1 * | 3/2009 | Patapoutian et al. | 714/795 |
| 2009/0231745 A1 * | 9/2009 | Venkataramani et al. | 360/39 |
| 2010/0050060 A1 * | 2/2010 | Ashley et al. | 714/792 |
| 2011/0161787 A1 * | 6/2011 | Hekstra et al. | 714/795 |

FOREIGN PATENT DOCUMENTS

| | | |
|---|---|---|
| EP | 0801501 A | 10/1997 |
| WO | 2006026334 A | 3/2006 |

OTHER PUBLICATIONS

William E. Ryan—"Comparative Performance Between Drop-Out Detection and Viterbi Reliability Metric Erasure Flagging", IEEE Transactions on Magnetics, vol, 28, No, 5, Sep. 1992, pp. 2898-2900.
Arvind R. Raghavan and Carl W. Baum—"A Reliability Output Viterbi Algorithm with Applications to Hybrid ARQ", IEEE Transactions on Information Theory, vol. 44, No. 3, May 1998, pp. 1214-1216.

(Continued)

*Primary Examiner* — Michael Maskulinski
*Assistant Examiner* — Neil Miles (57) ABSTRACT

Various embodiments relate to the production of erasure flags to indicate errors resulting from decoding of convolutional codes. A Viterbi decoder may use a register exchange method to produce a plurality of survivor codes. At a defined index, a majority vote may take place comparing values of bits in each of the survivor codes. This majority vote may involve obtaining both the quantity of high-order bits and the quantity of low-order bits and obtaining the difference of the two quantities. The absolute value of the difference of high-order bits to low-order bits may be compared to a defined threshold. When the absolute value difference is below the defined quantity, an erasure flag may be produced and associated with the bits of the defined index, indicating that they are eligible for erasure. In some embodiments, a Reed-Solomon decoder may use the erasure flag to target specific survivor bits or survivor bytes for error-correction through erasure.

20 Claims, 8 Drawing Sheets

OTHER PUBLICATIONS

Xue-Cheng Qian, Chun-Ming Zhao and Shi-Xin Cheng—"Reduced-Complexity Soft-Output Viterbi Equalizer", International Conference on Communication Technology, Oct. 1998, pp. S13-07-1 through S13-07-5.

Yasuo Harada, Qiang Wang and Vijay Bhargava—"Performance of the Concatenated Coding System with a Modified Erasure Declaration Viterbi Decoder", IEEE, 1994, pp. 1231-1235.

Joachim Hagenauer and Peter Hoeher—"A Viterbi Algorithm with Soft-Decision Outputs and its Applications", IEEE, 1989, pp. 1680-1686.

Vasily P. Pribylov and Alexander I. Plyasunov—"A Convolutional Code Decoder Design Using Viterbi Algorithm with Register Exchange History Unit" IEEE, 2005, pp. 10-15.

Robert H. Deng and Daniel J. Costello, Jr.,—"High Rate Concatenated Coding System Using Bandwidth Efficient Trellis Inner Codes", IEEE Transactions on Communications, vol. 37, No. 5, May 1989, pp. 420-427.

Nill C. et al., "List and soft-symbol output VAs: extensions and comparisons," IEEE Trans. on Commun., vol. 43, Nos. 2-4, pp. 277-287, Feb./Mar./Apr. 1995.

Fricke, J.C. et al., "Word error probability estimation by means of a modified viterbi decoder," IEEE Vehic. Techn. Conf. (VTC) 2007, pp. 1113-1116, Sep. 2007.

Cox, Richard et al., An efficient adaptive circular viterbi algorithm for decoding generalized tailbiting convolutional codes, IEEE Transactions on Vehicular Technology, vol. 43, No. 1, Feb. 1994.

Yeo et al., "Implementation of high throughput soft output viterbi algorithm with register exchange history unit," IEEE 2005, pp. 10-15.

Swaminathan, S. et al., "A dynamically reconfigurable adaptive viterbi decoder,"Department of Electrinical and Computer Engineering, University of Massachusetts (10 pages), Proc. of the 2002 ACM/SIGDA Tenth Int'l Symposium on FPGAs, pp. 227-236.

Hocevar D E et al.—Achieving flexibility in a viterbi decoder DSP coprocessor, Vehicular Technology Conference, 2000. IEEE VTS Fall VTC 2000. vol. 5, Sep. 24, 2000. pp. 2257-2264.

Bissi et al.—"A Multi-Standard Reconfigurable Viterbi Decoder using Embedded FPGA Blocks." Digital System Design: Architectures, Methods and Tools, 2006. DSD 2006. 9th EuroMicro Conference on IEEE, PI, Jan. 1, 2006, pp. 146-154.

Hendrix H—"Viterbi Decoding Techniques in TMS320C54x Family". Texas Instruments Technical Journal, Texas Instruments, Jun. 1, 1196, pp. 1-20.

European Search Report in related application EP 11 17 5619 dated Jun. 4, 2012.

* cited by examiner

|     | 461 | 462 | 463 | 464 | 465 | 466 | 467 | 468 |
| --- | --- | --- | --- | --- | --- | --- | --- | --- |
| 451 | F | 0 | 0 | F | 0 | 0 | 1 | 1 |
| 452 | F | 0 | 1 | F | 0 | 0 | 1 | 1 |
| 453 | F | 0 | 0 | F | 0 | 1 | 0 | 1 |
| 454 | F | 0 | 0 | F | 1 | 0 | 1 | 1 |
| 455 | F | 0 | 0 | F | 0 | 0 | 1 | 1 |

BITWISE RELIABILITY INDICATORS FROM SURVIVOR BITS IN VITERBI DECODERS

TECHNICAL FIELD

Various exemplary embodiments disclosed herein relate generally to error correction and error detection.

BACKGROUND

Modern communications systems are generally required to transmit data at both high rates and with little error. To satisfy such requirements, many communications systems employ error-control code to enhance system performance. Convolutional codes are a popular choice as codes used for error correction, due to both their capacity and reasonable coding simplicity. For example, convolutional codes are regularly used in various digital communications standards, such as DVB-T (Digital Video Broadcast-Terrestrial), which requires an average bit error rate (BER) of $2\times10^{-4}$ for quasi error-free (QEF) operation. ISDB-T (Integrated Service Digital Broadcasting-Terrestrial) is another standard that also employs convolutional codes and may require a similar BER for regular operation.

A classical concatenated coding system may contain a Viterbi decoder to receive and decode an code received over a channel, followed by a Reed-Solomon (RS) decoder that may be used to further identify and correct decoding errors. Based on the application, errors that occur in the Viterbi decoder may be random bit errors, or may alternatively occur in bursts of consecutive bit errors. When burst errors occur, the coding system may, for example, employ a byte structure of data, which may allow the RS decoder to simply isolate bytes that contain at least one error and correct the entire byte.

Some existing solutions using the Viterbi decoder and RS decoder series typically identify differences in the path metrics or sum of branch metrics over a local window. For example, the Soft Output Viterbi Algorithm (SOVA) observes path metrics at the input side of the Viterbi Algorithm and produces full, soft-output information for further processing by the RS decoder. However, such methods usually require extensive summation and storage of the path and branch metrics, which carry with it a non-negligible hardware cost.

In view of the foregoing, it would be desirable to enable an alternative error correction system and method for the Viterbi decoder and RS decoder series. In particular, it would be desirable to identify and mark errors for the RS decoder with a small computation and hardware cost.

SUMMARY

In light of the present need for error detection by the Viterbi decoder, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in the later sections.

Various embodiments may relate to a method for detecting errors in a survivor path. The method may include obtaining a survivor path reliability value from a plurality of survivor paths at a defined index, wherein the survivor path reliability value is based on the quantity of survivor paths sharing the same value at the defined index. The method may also include comparing the survivor path reliability value with a defined threshold.

Various embodiments may also relate to a storage unit to produce a binary convolutional code. The storage unit may include at least one register to produce a survivor path reliability value from bits of a plurality of survivor paths at a defined index, wherein the survivor path reliability value is based on the quantity of survivor paths sharing the same value at the defined index. The register may also compare the survivor path reliability values with a defined threshold It should be apparent that, in this manner, various exemplary embodiments enable the Viterbi decoder to identify and mark potential bit errors. Particularly, by comparing the margin of majority votes to a defined threshold, the Viterbi decoder may identify bits in the plurality of survivor paths that are not converging and are therefore likely to be errant.

BRIEF DESCRIPTION OF THE DRAWINGS

In order to better understand various exemplary embodiments, reference is made to the accompanying drawings wherein.

DETAILED DESCRIPTION

Referring now to the drawings, in which like numerals refer to like components or steps, there are disclosed broad aspects of various exemplary embodiments.

Figure 1A:
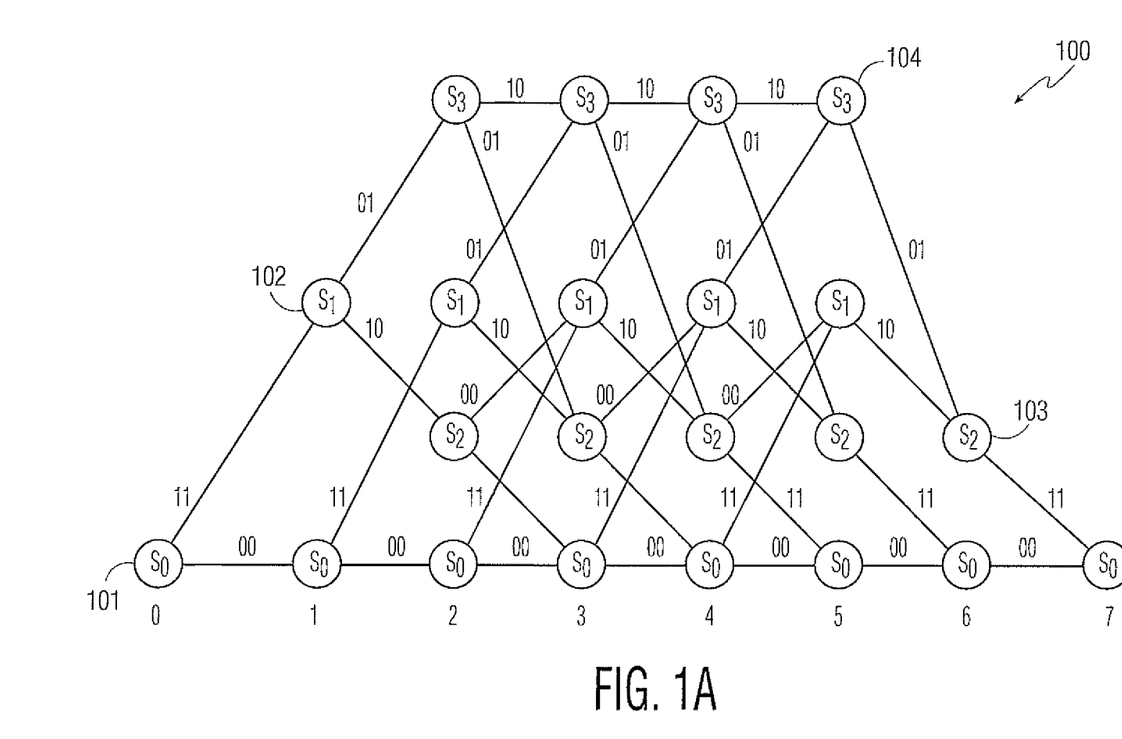
FIG. 1A illustrates a trellis diagram of an exemplary binary convolutional code.

FIG. 1A illustrates a trellis diagram of an exemplary binary convolutional code. A Viterbi decoder may receive input bits from binary convolutional codes. The binary convolutional code may be represented as (n, k, m), where a binary convolutional encoder produces n output bits by combining k input bits and the previous ink (where m is the memory order of the convolutional code) input bits. The Viterbi decoder may receive the binary convolutional code output sequence of n length, reconstruct, and output the k input bits of the original input sequence with a high probability. The possibilities of the binary convolutional code may be represented by a code tree that presents every codeword (i.e., code sequence) as a path on the tree. For example, an input sequence of L bits will have a corresponding code tree consisting of (L+m+1) levels, with the leftmost node at level 0 being the origin node and the rightmost nodes at level (L+m) being the terminal nodes. For the first L levels, there may be $2^k$ branches leaving each node. For nodes at levels L through (L+m), only one branch may leave from each node. Each path from the origin node to a terminal node may define a code path and may correspond to a distinct codeword. The codeword may form the output of the binary convolutional encoder for one period of its shift register.

Code trellis 100, therefore, may be a corresponding structure that may be obtained from a code tree by merging all nodes in the code tree that are in the same state. In the illustrated embodiment, for example, the code trellis 100 comprises a series of 8 levels that shows transitions between four states, $S_0$-$S_3$ 101-104. Due to the merging of nodes in the same state, only one terminal node may remain in a trellis, as all terminal nodes may merge to the same, final state. Similarly, each path from the origin node to the terminal node may represent a distinct codeword. Accordingly, an S-level trellis may have $2^{S-1}$ paths and $2^{S-1}$ codewords.

In the illustrative embodiment, the code trellis 100 contains a number of states 101-104 and stages 0 to 7. In the code trellis 100, each transition between states (e.g., from $S_0$ 101 to $S_1$ 102) may possess a corresponding metric or distance that may be defined as a branch metric. In some embodiments, a Viterbi decoder may calculate the branch metrics for each state transition. In some embodiments, the Viterbi decoder may also store a limited number of paths that possess the shortest distances relative to the received sequence through the combination of branch metrics. These paths stored by the Viterbi decoder may be defined as survivor paths.

Figure 1B:
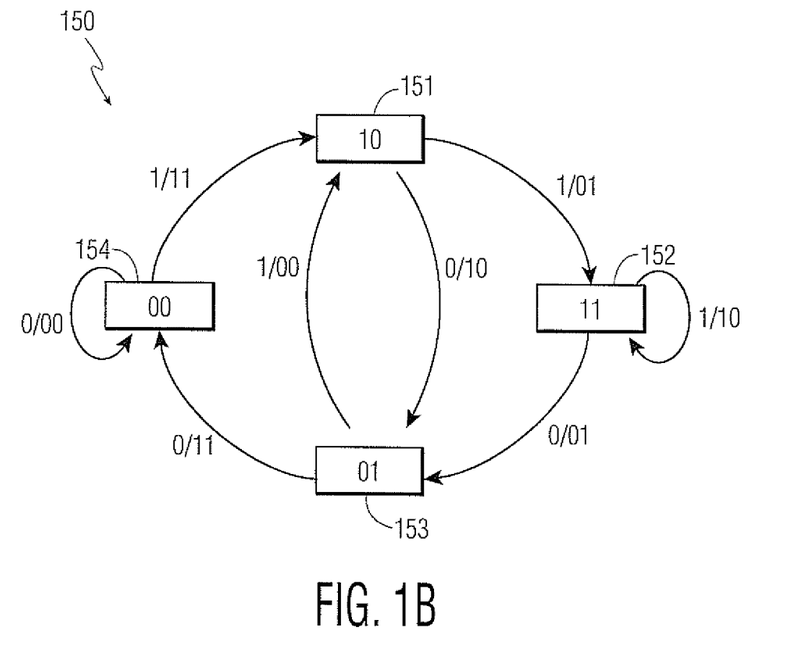
FIG. 1B illustrates a state diagram of a corresponding exemplary binary convolutional code.

FIG. 1B illustrates a state diagram of a corresponding exemplary binary convolutional code. As will be discussed in further detail below in relation to FIG. 2B, a binary convolutional encoder (not shown) may be a device component that outputs a binary convolutional codeword. The convolutional codeword that is output from the binary convolutional encoder may be used, for example, as a component in an error correcting code. In some embodiments, the binary convolutional encoder may include a plurality of shift registers and modulo-2 (mod-2) adders. The output bits of the binary convolutional encoder may be modulo-2 additions of selective shift register contents and present input bits, which may result in a code rate of ½. More general convolutional codes with a ratio of number of message bits to number of coded bits may be different from ½ and may have multiple input and output bits per trellis section.

The binary convolutional encoder may also be implemented as a finite state machine (FSM). In such an implementation, the contents of the shift registers may represent the various states 151-154 of the FSM. Therefore, the output of the FSM at a given time may depend on the current state of the machine. For the binary convolutional encoder, each change of state 151-154 may be represented with the input of an input bit and the output of an output bit.

FIG. 1B shows state diagram 150 of the binary convolutional encoder. State diagram 150 comprises a number of possible states 151-154, with state transitions between each state. Each possible state transition is labeled with the corresponding input and output (i.e., 0/11 represents input bit 0 and output bits 11). The trellis 100 of FIG. 1A may illustrate a number of possible state sequences for state diagram 150 of binary convolutional encoder when given a specific initial state. For example, if the initial state in the illustrative embodiment corresponds with state "01" 153, then $S_1$ 101 at level 1 corresponds to state "00" 154 and $S_2$ 102 at level 1 corresponds to state "10", respectively.

Figure 2A:
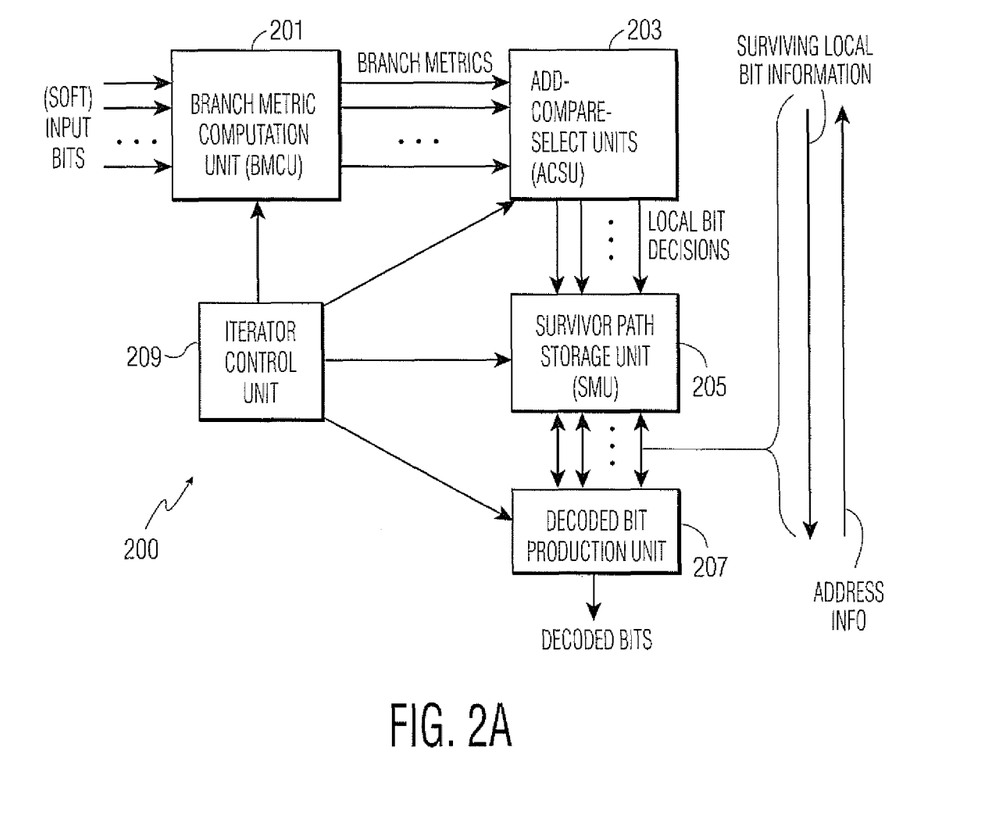
FIG. 2A illustrates a functional block of an exemplary Viterbi decoder.
Figure 2B:
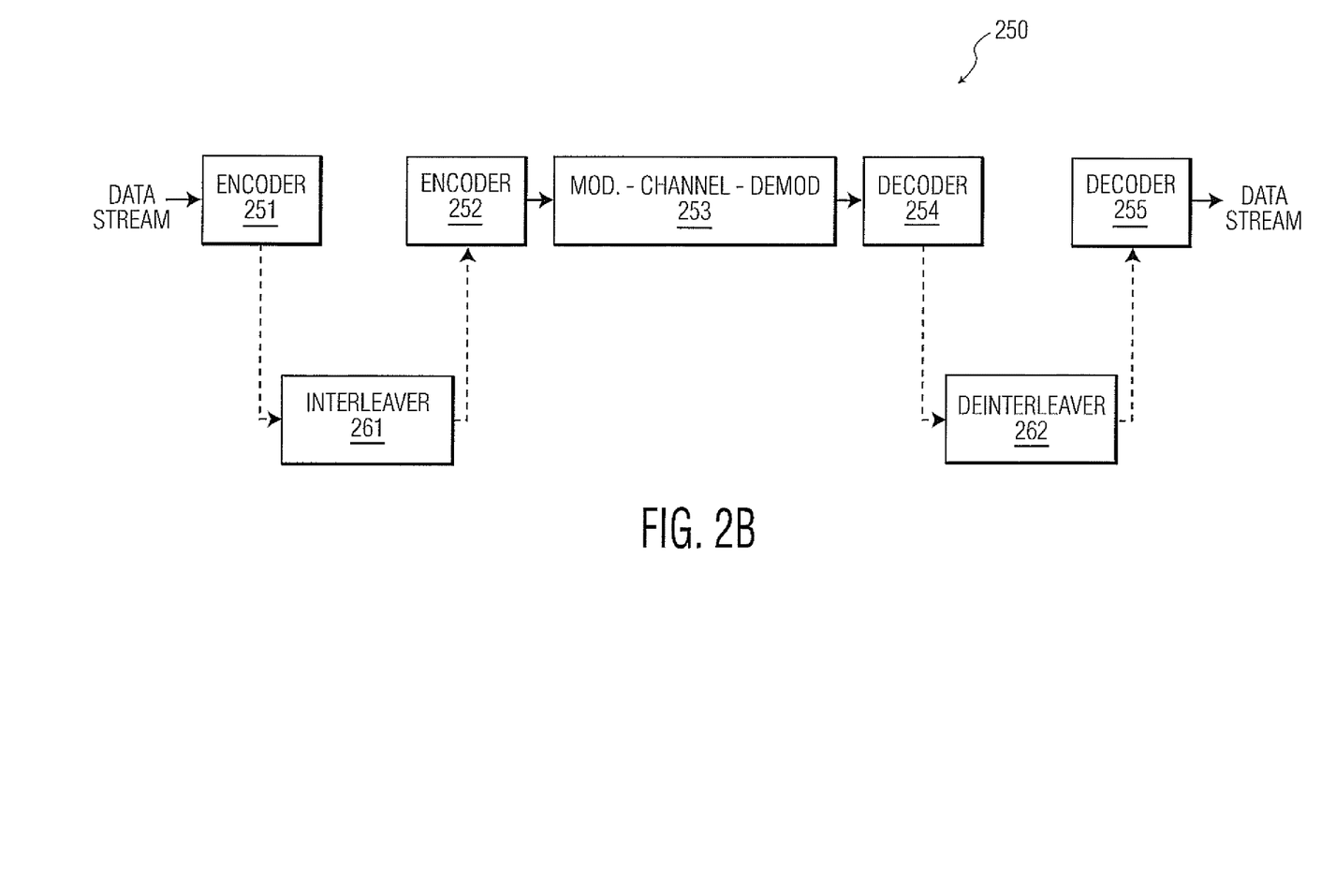
FIG. 2B illustrates a functional block of an exemplary coding system.

FIG. 2A illustrates a functional block of an exemplary Viterbi decoder. Viterbi decoder 200 may be a component of a computer system that decodes bit streams that were encoded with a binary convolutional codeword. Viterbi decoder 200 may also be a component of a coding system 250 to decode bit streams and correct errors in decoding, as will be discussed below in relation to FIG. 2B. Viterbi decoder 200 may contain various components shown in FIG. 2, in addition to other components not shown in FIG. 2, but that may be identified by a person of ordinary skill in the art upon reading this disclosure. According to one embodiment, the functional blocks forming the Viterbi decoder 200 may comprise a Branch Metric Computation Unit (BMCU) 201, an Add-Compare-Select Unit (ACSU) 203, a Survivor Path Storage Unit (SPSU) 205, a Decoded Bit Production Unit (DBPU) 207, and an Iterator Control Unit (ICU) 209. It will be understood that FIG. 2 is a functional diagram representing one example implementation of one Viterbi decoder 200 according to one embodiment; other hardware implementations may be different, yet contain the same functionality as that described and illustrated herein.

During an exemplary operation, the Viterbi Decoder 200 may receive a series of input bits forming a binary convolutional codeword and decode the input bits using the Viterbi Algorithm to obtain with high probability the optimal survivor path representing the sequence that entered the binary convolutional encoder. More specifically, the Branch Metric Computation Unit (BMCU) 201 may receive a series of input bits, starting with the terminal bit from a transmission or storage channel, and may calculate the corresponding branch metrics from these inputs. Add-Compare-Select Unit (ACSU) 203 may receive the plurality of branch metrics produced by the BMCU 201 and recursively accumulate the branch metrics as path metrics for a plurality of possible paths through the trellis. ACSU 203 may then compare the accumulated path metrics with each other for a given level in the trellis and may make a decision, selecting the most likely state transition that would constitute an applicable survivor path. ACSU 203 may then generate a plurality of decision bits corresponding to the chosen state transition. Survivor Path Storage Unit (SPSU) 205 may receive and store the decision bits from the ACSU 103 to build the complete survivor path and may also produce surviving local bit information. DBPU 207 may receive the surviving local bit information and produce decoder output bits ("decoded bits") as an output, which may be in the form of a state sequence. DBPU 207 may also send address information back to the SPSU 205.

Branch Metric Computation Unit 201 may calculate branch metrics associated with the possible distances between nodes on consecutive levels. More specifically, the branch metrics may be defined as a normalized distance between nodes in a trellis. As an example, the BMCU 201 may calculate Hamming distances for the 11 and 00 transitions between level 7 and level 6 (shown in FIG. 1A) from state $S_0$ to states $S_2$ and $S_0$, respectively. The branch metrics may therefore represent the cost of traversing along a specific branch between nodes in the code trellis 100. A hard-decision Viterbi decoder may receive a simple bitstream on its input, with a Hamming distance used as a metric. Comparatively, a soft-decision Viterbi decoder may receive a bitstream that also contains information regarding the reliability of each received symbol, with the squared Euclidean distance used as a metric for the soft-decision Viterbi decoder. In some embodiments, the BMCU 201 may calculate new branch metrics for each input bit during every clock cycle, as during each clock cycle, the BMCU 201 may receive a new input bit that represents a new level in the trellis.

Add-Compare-Select Unit (ACSU) 203 may accumulate the branch metrics received from the BMCU 201 to create metrics in the form of path metrics for a plurality of paths through the code trellis 100. Path metrics, also known as state metrics, may collect the total minimum cost of arriving into a specific state from an initial state, which may be in the form of a sum of a series of connected branch metrics. Such a cost function may be in a form, for example, of a function based on the decreasing likelihood of the path between the initial state and the specific state. A commonly-used function in implementation for such a function of the likelihood may be the logarithmic or log-likelihood function.

The Add-Compare-Select (ACS) algorithm in the ACSU 203 may update the path metrics recursively. The ACS algorithm may update recursively by adding branch metrics to the path metrics of the previous time instant. For example, during every clock cycle, the ACSU 203 may update the plurality of path metrics through the receipt of branch metrics from the BMCU 201. For example, after receiving the branch metrics for level 5, the ACSU 203 may append the branch metrics of the new level to a stored path metric. For example, if the ACSU 203 previously decided on the "11" branch from the terminal state, the ACSU 203 may add metrics associated with the "01" and "10" branches, respectively, to the stored path metric.

Once the path metrics are appended, the ACSU 203 may then compare the outcomes of the two appended paths. ACSU 203 may compare the path metrics of the two paths by conducting a subtraction of the two candidate path metrics, with the most significant bit of the difference pointing to a larger one of the two. For example, if the "10" transition has a smaller metric than the "01" transition, the path metric containing the "10" transition will be smaller, as the two path metrics may be identical, except for the appended branch metrics. After performing a subtraction from the path metric with the "01" transition, the "01" path metric may contain the most significant bit. This may serve as a signal to indicate that the ACSU 203 should select the path metric containing the "10" transition, as it is the smallest.

Finally, the ACSU 203 may then select the path with the minimum overall metric. When making a selection decision during a given clock cycle, the ACSU 203 may discard non-optimal paths and output the chosen path to the SPSU 205. For example, when the "10" branch is the smaller metric, the ACSU 203 may select its associated path as the survivor path. The smaller path metric of the two is selected to be the new path metric (i.e., survivor path) for a given state. When all the input data is processed through the BMCU 201 and the ACSU 203, the complete minimum path metric outputted may be the complete survivor path that represents the best-likelihood estimation of the input sequence into the binary convolutional encoder. In some embodiments, for example, the minimum path metric may have the smallest value for its path metric relative to the received sequence. Recursively tracing backwards along the trellis of state transitions used by the binary convolutional encoder, the survivor path constructed by the ACSU 203 may represent the likely sequence of transmitted data as it entered the binary convolutional encoder.

SPSU 205 may receive from the ACSU 203 information that represents the current selected minimum metric path. Though theoretically requiring the entire input sequence, in practice, paths through the code trellis 100 generally merge to a common survivor path after a number of iterations. From the point that multiple paths merge to the terminal state, however, the decoding is still unique. The depth at which all the survivor paths merge with high probability is defined as the survivor path length.

SPSU 205, as will be discussed below in relation to FIG. 3, may use a plurality of methods to update the survivor path to reflect the added information presented by the ACSU 203. For example, when the SPSU 205 uses the trace back method, the ACSU 203 may present a trace back bit to indicate the path chosen, with the survivor path merely storing a collection of these trace back bits in sequence. In contrast, when the SPSU 205 uses the register exchange method, the SPSU 205 updates the survivor path by copying the entire survivor path, appending the bit corresponding to the chosen state and when the survivor path is at its discrete length limit, removing the oldest bit. SPSU 205 may then forward the surviving local bit information in the form of the abridged survivor path or the survivor path comprised of trace back bits to the DBPU 207.

Decoded Bit Production Unit (DBPU) 207 may receive the surviving local bit information and may use this information to output decoded output bits ("decoded bits"). DPBU 207 may also forward to the SPSU 205 address information.

Iterator Control Unit (ICU) 209 may control BMCU 201, ACSU 203, SPSU 205, and DBPU 207 through a plurality of control signals.

FIG. 2B illustrates a functional block of an exemplary coding system. Coding system 250 may be, for example, a concatenated coding system that may send a stream of data at a high rate over a communications channel, with the data stream being encoded before the transmission over the communications channel, with the receiver decoding the original data stream. Coding system 250 may include an encoder pair 251-252 ("supercoder") and a decoding pair 254-255 ("superdecoder") on either side of a modulation-channel-demodulation block 253. Through the use of "outer" blocks 251, 255 and "inner" blocks 252, 254, codes may be constructed from two or more simpler codes to achieve complexity, while still enabling high performance and simplicity. In some embodiments, an interleaves 261 may be located between the first encoder 251 and second encoder 252, while a matching deinterleaver 262 may be located between the first decoder 254 and the second decoder 255.

Encoder pair 251-252 may comprise the first encoder 251, which may be an "outer" encoder, and the second encoder 252, which may be an "inner" encoder. In some embodiments, the entire encoder pair 251-252 may be components of a single transmitter. In some embodiments, the encoder pair 251-252 comprises a plurality of forward error correction (FEC) encoders, which may be used, for example, for error control in data transmission and/or data storage.

Outer encoder 251 may be a Reed-Solomon (RS) encoder that may be used in to build codes. RS encoder 251 may comprise a shift register that may use a number of registers and multiplier co-efficients to produce a code. RS encoder 251 may receive a data stream and build an RS code, which may be used to detect and/or correct multiple random symbol errors in the data stream it receives. RS encoder 251 may construct a Reed-Solomon code, which may be a systematic code in the form of a block code. The RS code may be split into fixed length blocks, with each block split into a number of bit symbols. In some embodiments, the RS code may contain the original information included in the data stream in addition to cyclic redundancy check (CRC) or parity bits appended. In some embodiments, the length of the RS codeword that includes the data and the parity bits, may be of equal length to the convolutional codeword.

Inner encoder 252 may be a convolutional encoder that receives the Reed-Solomon code and generates a convolutional code. The convolutional encoder may be similar to the binary convolutional encoder described in relation to FIG. 1. The convolutional code may have a short constraint length in order to maintain a high speed. Convolutional encoder 252 may also comprise a shift register and other combinational logic devices that performs modulo-2 addition. For example, when the convolutional encoder 252 receives the RS code at a rate of k bits per second, it may output a convolutional codeword at a rate of 2k bits per second that are then set into the channel.

Modulation-Channel-Demodulation (MCD) block 253 may be a channel that transmits codes received from the encoder pair 251-252 to the decoder pair 254-255. In some embodiments, the MCD block 253 may be a transmission block that sends the received code through a transmission channel from the encoder pair 251-252 to the decoder pair 254-255. In other embodiments, the MCD block 253 may use a storage channel.

Inner decoder 254 may be a Viterbi decoder that receives the convolutional code over the transmission or storage channel and produces a series of decoded bits for the outer encoder 255. In some embodiments, the inner encoder 254 may act in a similar manner to the Viterbi decoder 200 of FIG. 2A. In some embodiments, a series of erasure flags may be added, to survivor paths created in the Viterbi decoder 254, so some of the decoded bits may contain associated erasure flags.

Outer decoder 255 may be a Reed-Solomon (RS) decoder that receives the decoded bits from the inner decoder 254 and corrects errors and/or erasures that are included in the decoded bits. In some embodiments, the RS decoder 255 may process the decoded bits in a series of blocks. For example, the RS decoder 255 may process the decoded bits in groups that are sized to one byte. In some embodiments, the RS decoder 255 may also attempt to correct all the bits in a block, when at least one of them is found to be in error. This may be particularly useful to correct burst errors. In some embodiments, the RS decoder 255 may identify the erasure flags associated with some of the received decoded bits and correct the identified bits.

Figure 3:
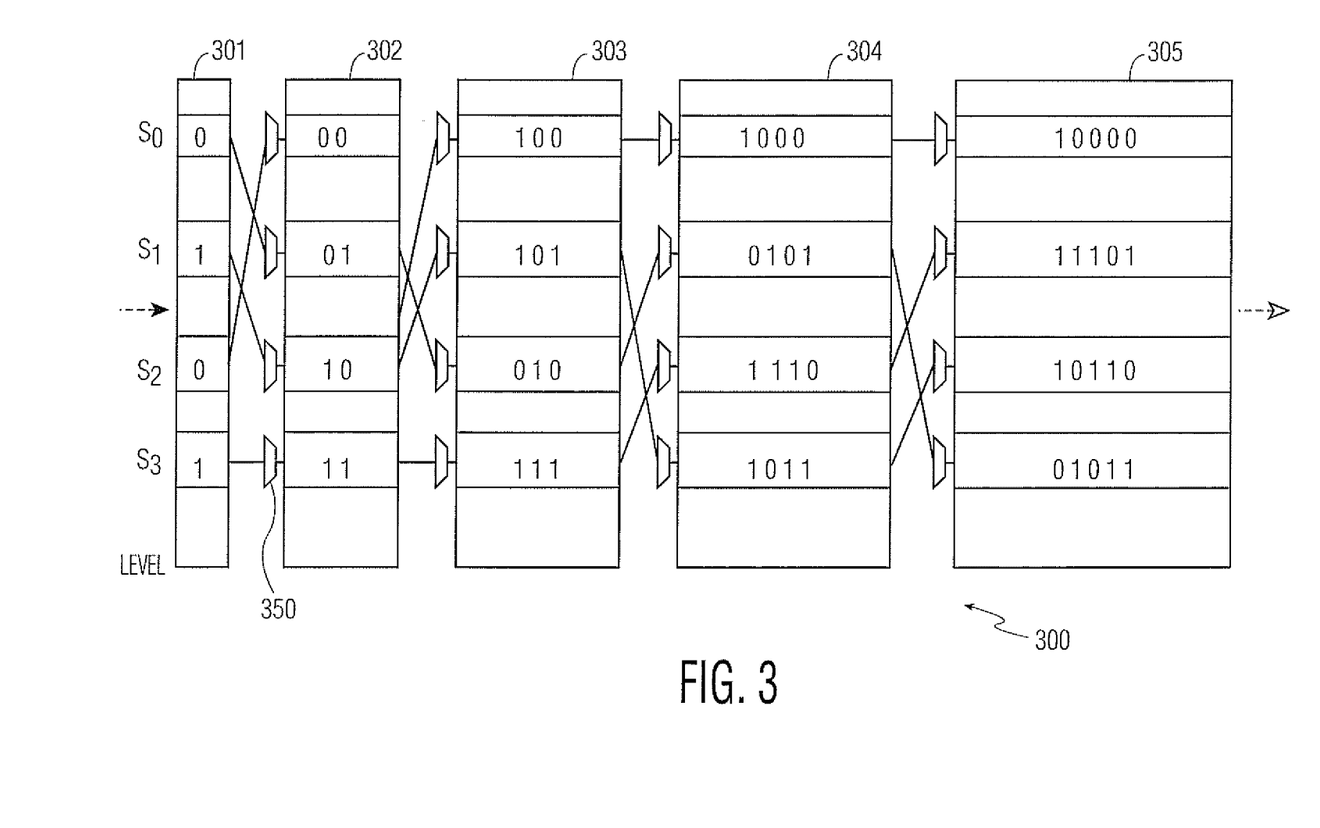
FIG. 3 illustrates a functional block of an exemplary Survivor Path Storage Unit implementing a register exchange method.

FIG. 3 illustrates a functional block of an exemplary Survivor Path Storage Unit implementing a register exchange method. In alternative embodiments, the SPSU 300 may implement the Viterbi algorithm using a trace back method, which is known to those of skill in the art. In the illustrated embodiment, the SPSU 300 contains a series of path register columns 301-305, and an array of multiplexers 350 (only one of which has been labeled, for clarity). In the illustrated embodiment, the array of multiplexers and registers may be connected to resemble the code trellis 100 of the binary convolutional encoder. In the array, a register may be assigned to each state at each level. For example, for Level 2 at path register column 301, there may be four registers for states $S_0$-$S_3$. SPSU 300 may use a series of registers through register columns 301-305 to record the decoded output sequence produced from ACSU 203 along a path from the initial state to the final state. At the last stage (in the illustrative embodiment, the register column 305), the decoded output sequence may be the one stored as the complete survivor path, representing the minimum path metric.

The depth of the array of multiplexers and registers may, for example, be five times larger than the value of the constraint length of x in order to prevent significant performance degradation. A person of skill in the art would know of other depths to prevent performance degradation (e.g., an array depth twelve times larger than the constraint length). The exact value may be chosen based on a number of factors, such as the amount of error-correction performance required, type of communications channel used, type of interleaves being used, and the implementation complexity of the Viterbi algorithm. Turning to the survivor path, the code trellis 100 of FIG. 1 illustrates an exemplary code trellis for a constraint length equal to 3. There may therefore be 15 levels in order to prevent significant performance degradation. The size of registers increases through the consecutive register columns 301-305 to account for the appended bits used to construct the survivor paths. Multiplexers 350 may be connected to the input of each register in register columns 301-305. Multiplexers 350 may be used to connect multiple registers to the input of a given register. In the illustrated embodiment, the illustrated lines represent the chosen input for a register in register paths 302-305.

During regular operation, a register in the register column 302-305 may copy the entire contents of a register in the previous register column 301-304. For example, the register for $S_2$ in the register column 304 may copy "111" from the $S_3$ register in register column 303. The $S_2$ register in register column 304 may then append the decoded bit received from ACSU 203 to the end to create the new survivor path "1110". This process may continue from the initial state to the terminal state until a complete survival path is produced. Because a register in the register column 301-304 may possibly input into multiple registers in the subsequent register column 302-305, the SPSU 300 may contain $2^{x-1}$ states at each stage. For example, FIGS. 1A-1B illustrate trellis and state diagrams for a binary convolutional encoder of constraint length 3. SPSU 300 may therefore contain $2^{3-1}=2^2=4$ states, and therefore 4 registers, at each stage.

Figure 4A:
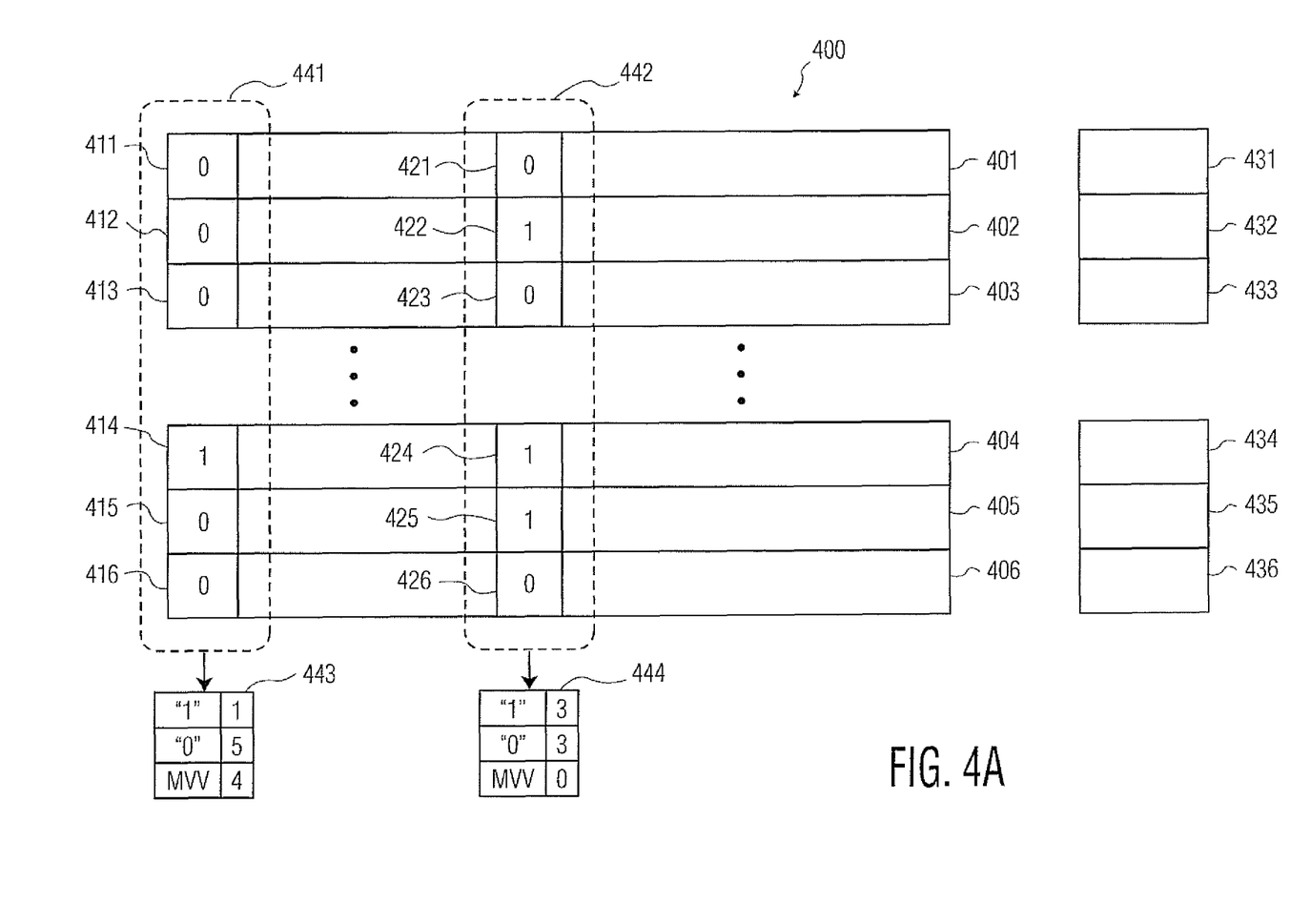
FIG. 4A illustrates a functional block of an exemplary Survivor Path Storage Unit producing a majority vote value.

FIG. 4A illustrates a functional block of an exemplary Survivor Path Storage Unit producing a majority vote value. SPSU 400 may be similar to the SPSU 300 of FIG. 3, as it may use the regular exchange method to save new data for survivor paths. SPSU 400 may also have additional components used to identify potential errors in the survivor paths. In the illustrative embodiment, the SPSU 400 may contain a plurality of survivor paths 401-406, including oldest survivor bits 411-416 and other survivor bits 421-426. SPSU 400 may also include path metrics 431-436, indices 441-442, and majority vote tables 444-445. In some embodiments, the SPSU 400 may employ an algorithm to limit the scope of searches used to build the complete survivor paths and therefore, the number of survivor paths 401-406 saved in the SPSU 400 at a given time. For example, the Viterbi decoder 200 may conduct a limited search algorithm, where certain paths are purged in lieu of computing and keeping $2^{x-1}$ states at each stage, where x represents the constraint length of the convolutional codeword.

For example, during the decoding stage in the ACSU 203 of the Viterbi decoder 200 that uses the limited search algorithm, only some of the most likely paths with the accumulative path metric satisfying a certain preset threshold from the best path metric are kept by the SPSU 205. This comparison to a threshold may be done by the ACSU 203 before reaching the SPSU 205. As a result, SPSU 300 may store and update fewer survivor paths than theoretically necessary. This may result, for example, in a large reduction of computation in the ACSU 203, while only resulting in a small increase in degradation.

During an exemplary operation, a majority vote may take place in at least one of the indices 441-442. For example, at the oldest index 441, the oldest survivor bits 411-416 may be tallied, with the quantities of high-energy bits (here, a logical "1") and low-energy bits (a logical "0") being stored. SPSU 400 may then generate and store the majority vote value by calculating the absolute value of the differences between the high-value and low-value quantities. As will be discussed in further detail below, the majority vote value may be compared to a threshold value when the value is too low, the SPSU 400 may tag all the bits at the applicable index with an erasure flag.

For example, in the illustrative embodiment, the oldest index 441 may take a majority vote of the oldest bits 411-416 included in the plurality of survivor paths 401-406. While only six survivor paths are illustrated for clarity, various embodiments may include more or less survivor paths based on the needs of the application. As will be discussed in relation to FIG. 5, when a majority vote is tallied at the oldest index 441, the values in the majority vote table 443 may be completed. In the illustrative embodiment, there are five oldest bits 411-413, 415-416 that contain a low-energy bit (i.e., a logical "0"), with one of the oldest bits 414 containing a high-energy bit (a logical "1"); these values may be calculated and stored in the majority vote table 443. From these two quantities, the SPSU 400 may generate a majority vote value, which may be equal to the absolute value of the difference between the quantity of high value bits and the quantity of low value bits. For example, for the oldest index 441, the corresponding majority vote value may be equal to |1−5|=|−4|=4, which may also be stored in the majority vote table 443.

After the majority vote value is tabulated, the majority vote value may be compared to a threshold value. The threshold value may be a defined value that indicates a level of convergence in the survivor paths. In some embodiments, the defined threshold value for a given index may be manually set based, for example, on the level of sensitivity required for the possibility of errors. In other embodiments, the threshold value may be set and modified dynamically by the SPSU 400 or other devices in the Viterbi decoder or RS decoder based on the level of error sensitivity required. As illustrated in the series of survivor paths 451-455 in FIG. 4B, when the majority vote value is below the threshold, the APSU may assign an erasure flag with the oldest bits 411-416 in the oldest index 441, as the value below the defined threshold may indicate that the values at that time are not converging enough based on the given value. For example, at the oldest index 441, there may be a comparatively high threshold, as most survivor paths converge to a specific value, such that there may be a 95% probability that the value of an oldest bit at the oldest index 441 may be a logical "0". In contrast, the defined threshold for majority votes at a later index might be lower, as there may be a smaller probability that the bits at the later index converge to the same value. For example, when the number of survivor paths is 64, the defined threshold at the oldest index 441 may be 60, while the defined threshold at later index 442 may be 50.

In some embodiments, the SPSU 400 may employ more than one index in order to conduct majority votes at different stages during the creation of the survivor path. For example, in some embodiments, a second index may be located a distance of one byte after the oldest index in order to determine the placement of erasure flags in another code block. In the illustrative embodiment, the later index 442 may also tally a majority vote to determine whether to tag the later bits 421-426 with erasure flags. Here, the number of high-energy bits and low-energy bits are equal, so the resultant majority vote value is therefore equal to zero. The majority vote value may therefore be below the defined threshold, so the SPSU 400 may tag the later bits 421-426 with erasure flags, which may be later corrected when passed to the RS decoder 255.

In some embodiments, when the indices 441, 442 are spaced so that they may flag survivor bits in the same block, an erasure flag at either of the indices 441, 442 may later cause the RS decoder to erase the entire code block. In alternative embodiments, erasure flags added by both indices 441, 442 may be necessary for the RS decoder to erase the applicable code block. In alternative embodiments, the quantities of high-energy bits and low-energy bits at both indices 441, 442 may be added together before calculating the majority vote value and comparing with a defined threshold.

Figure 4B:
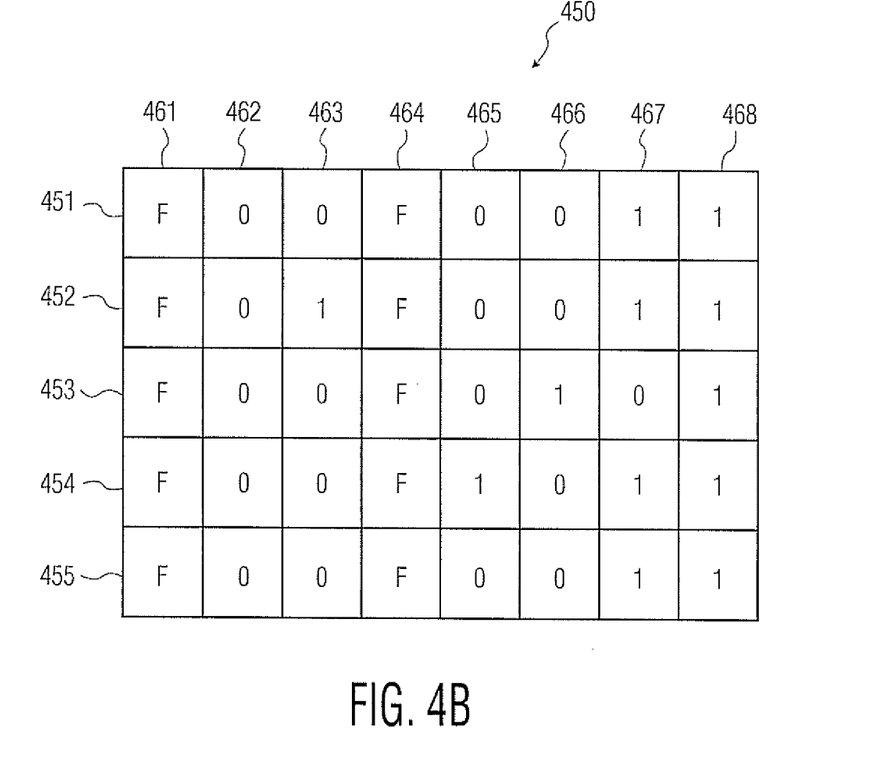
FIG. 4B illustrates an exemplary plurality of survivor paths marked with erasure flags.

FIG. 4B illustrates an exemplary plurality of survivor paths marked with erasure flags. The series of survivor paths 450 may include individual survivor path 451-455. Each of the survivor paths 451-455 may include a series of survivor bits 461-468. In the illustrative embodiment, the oldest bits 461 and the survivor bits 464 have been processed through indices similar to the oldest index 441 and the later index 442 in FIG. 4A.

In the illustrative embodiment, both of the majority vote values at the survivor bits 461, 464 were determined to be below the defined thresholds, so that the SPSU 400 tagged each of the survivor bits 461, 464 with an erasure flag. In the illustrative embodiment, the erasure flag replaces the value that was stored in the survivor bits 461, 464. In alternative embodiments, the SPSU 400 may maintain the value included in the survivor bits 461, 464, while associating the applicable survivor bits with an erasure flag. Such methods of association will be known to one of skill in the art. In contrast, the survivor bits 462, 468 will not have an erasure flag attached when a majority vote is tallied, due to the convergence to the same value. The association of erasure flags to the survivor bits 463, 465-467 may depend upon the value of the defined threshold.

In alternative embodiments, the SPSU 400 may employ the trace back method when performing the Viterbi algorithm. In some of such embodiments, the Viterbi decoder 200 may use all the results of the calculations by the ACSU 203 to store and trace back an entire sequence relative to the received sequence. In such instances, the ACSU 203 may separately store a distinct difference value for each bit in the sequence. ACSU 203 may store the series of difference values as a distinct sequence traced through the code trellis 100. The SPSU 400 may then, for example, retrieve and analyze these difference values and append erasure flags to difference values that exceed a defined threshold value for that level in the sequence.

Figure 5:
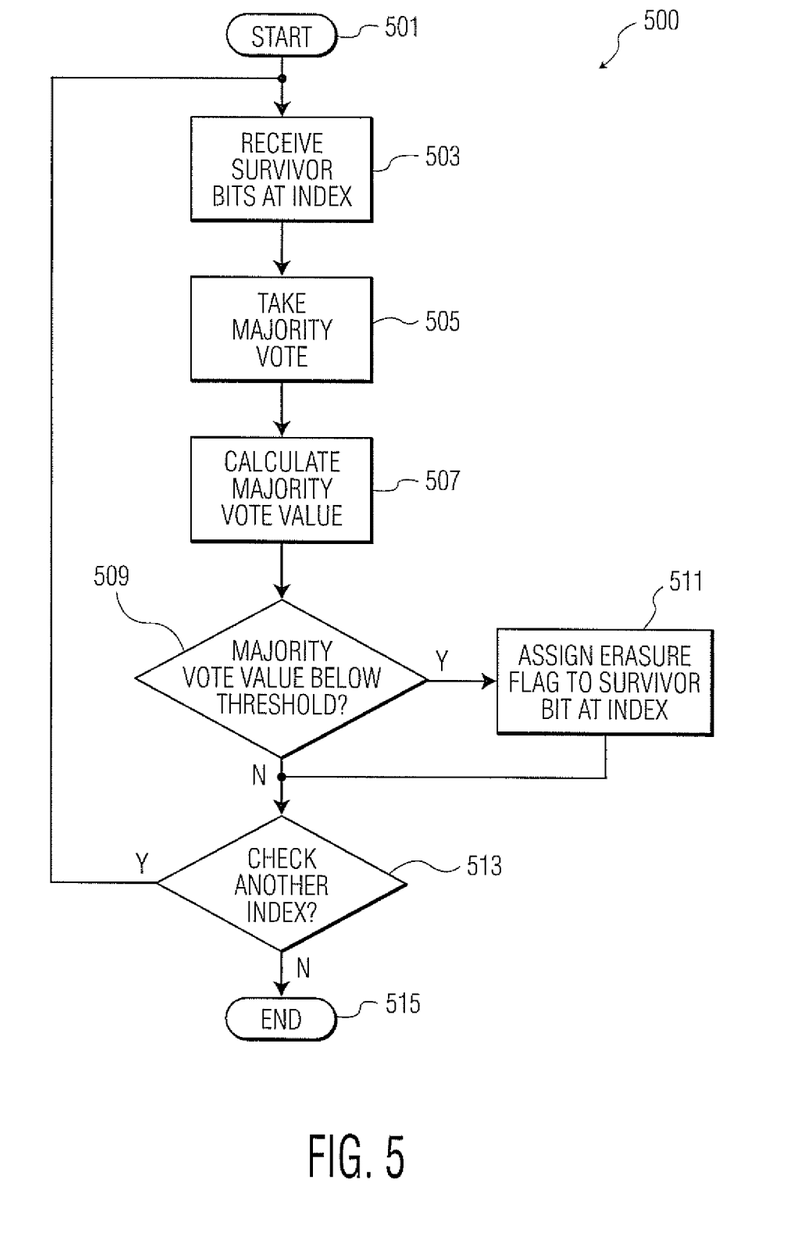
FIG. 5 illustrates an exemplary flowchart for producing an erasure flag.

FIG. 5 illustrates an exemplary flowchart for producing an erasure flag. Method 500 may be employed by the SPSU 400 when the oldest bits 411-416 of the survivor paths 401-406 reach the oldest index 441. Method 500 may begin at step 501 and continue to step 503, where the SPSU 400 receives survivor bits from a plurality of survivor paths at an index. For example, the SPSU 400 may receive the oldest bits 411-416 from the survivor paths 401-406 through at the oldest index 441.

In step 505, the SPSU 400 may take a majority vote at the index. From the majority vote, the SPSU 400 in step 507 may calculate the majority vote value. For example, the SPSU 400 may in step 505 determine the quantity of survivor bits 411-416 that contain high-energy bits and the quantity that contain low-energy bits. SPSU 400 may then in step 507 calculate the majority vote value by subtracting these two quantities and taking the absolute value of the result.

SPSU 400 in step 509 may then compare the majority vote value to a defined threshold. When the majority vote value is below or equal to the threshold, the SPSU 400 may then proceed to step 511, where it assigns erasure flags to the survivor bits at the index. Otherwise, the SPSU 400 may proceed to step 513 when the majority vote value is above the threshold. For example, when the SPSU in step 507 determines a majority vote value of four, it may compare this value with the defined threshold at the oldest index 441. When the defined threshold is high (e.g., equal to four), the SPSU 400 may in step 511 tag each of the oldest bits 411-416 with erasure flags. Conversely, when the threshold is lower (e.g., equal to two), the SPSU 400 may refrain from assigning erasure flags to the oldest bits 411-416.

In step 513, the SPSU 400 may determine whether to check another index. This may occur, for example, when a later index, such as the later index 442, is also used by the SPSU 400 to determine whether to tag erasure flags. When there is another index to check, the SPSU 400 may return to step 503; otherwise, the SPSU 400 may end method 500 at step 515.

It should be apparent from the foregoing description that various exemplary embodiments of the invention may be implemented in hardware and/or firmware. Furthermore, various exemplary embodiments may be implemented as instructions stored on a machine-readable storage medium, which may be read and executed by at least one processor to perform the operations described in detail herein. A machine-readable storage medium may include any mechanism for storing information in a form readable by a machine, such as a personal or laptop computer, a server, or other computing device. Thus, a machine-readable storage medium may include read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principals of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. A method for detecting errors, the method comprising:
    obtaining a first survivor path reliability value from a plurality of survivor paths at a first defined index, wherein the obtained first survivor path reliability value is based on a quantity of survivor paths sharing a common value at the first defined index;
    obtaining a quantity of survivor paths at the first defined index containing high-value bits to produce a high-value quantity;
    obtaining a quantity of survivor paths at the first defined index containing low-value bits to produce a low-value quantity; and
    obtaining the first survivor path reliability value by obtaining an absolute value of a difference between the produced high-value quantity and the produced low-value quantity; and
    comparing the obtained first survivor path reliability value with a first defined threshold.

2. The method of claim 1, wherein the first defined index is located at an oldest bit for each survivor path.

3. The method of claim 1 further comprising:
    generating an erasure flag when the first survivor path reliability value is smaller than the first defined threshold, wherein the generated erasure flag marks the survivor path values at the first defined index for deletion.

4. The method of claim 3, further comprising:
    erasing the survivor path values in the plurality of survivor paths that are marked with the generated erasure flag.

5. A method for detecting errors, the method comprising:
    obtaining a first survivor path reliability value from a plurality of survivor paths at a first defined index, wherein the obtained first survivor path reliability value is based on a quantity of survivor paths sharing a common value at the first defined index:
    comparing the obtained first survivor path reliability value with a first defined threshold; and
    forwarding the first survivor path reliability value to a Forward Error Correction (FEC) controller, wherein the FEC controller receives the forwarded survivor path reliability value as a soft input.

6. The method of claim 1, further comprising:
    obtaining a second survivor path reliability value at a second defined index, wherein the obtained second survivor path reliability value is based on the quantity of survivor path values at the second defined index sharing a common value.

7. The method of claim 6, further comprising:
    generating the erasure flag when either the first or the second survivor path reliability value is smaller than the first defined threshold, wherein the generated erasure flag marks the survivor path values at the first and the second defined indices for deletion.

8. The method of claim 6, further comprising:
    generating an erasure flag when the second survivor path reliability value is smaller than a second defined threshold, wherein the generated erasure flag marks the survivor path values at the second defined index for deletion and the first defined threshold is not equal to the second defined threshold.

9. The method of claim 6, further comprising:
    generating the erasure flag when both the first and second survivor path reliability values are smaller than the first defined threshold, wherein the generated erasure flag marks the survivor path values at the first and the second defined indices for deletion.

10. A storage unit to produce a binary convolutional code, the storage unit comprising:
    a register that is configured to obtain a first survivor path reliability value from bits of a plurality of survivor paths at a first defined index, wherein the obtained first survivor path reliability value is based on a quantity of survivor paths sharing a common value at the first defined index, obtain a quantity of survivor paths at the first defined index containing high-value bits to produce a high-value quantity, obtain a quantity of survivor paths at a defined index containing low-value bits to produce a low-value quantity, and obtain the first survivor path reliability value by obtaining an absolute value of a difference between the produced high-value quantity and the produced low-value quantity, and compare the obtained first survivor path reliability value with a first defined threshold.

11. The storage unit of claim 10, wherein the first defined index is located at an oldest bit for each survivor path.

12. The storage unit of claim 10, wherein the storage unit further comprises:
    an erasure flag generator that is configured to generate an erasure flag when the first survivor path reliability value is smaller than the first defined threshold, wherein the generated erasure flag marks the survivor path values at the first defined index for deletion.

13. The storage unit of claim 12, further comprising:
a Reed-Solomon decoder that is configured to erase the survivor path values in the plurality of survivor paths that are marked with an erasure flag.

14. A storage unit to produce a binary convolutional code, the storage unit comprising:
a register that is configured to obtain a first survivor path reliability value from bits of a plurality of survivor paths at a first defined index, wherein the obtained first survivor path reliability value is based on a quantity of survivor paths sharing a common value at the first defined index, compare the obtained first survivor path reliability value with a first defined threshold, and a Forward Error Correction (FEC) controller is configured to receive the first survivor path reliability value as a soft input.

15. The storage unit of claim 10, wherein the register is further configured to obtain a second survivor path reliability value at a second defined index, wherein the second survivor path reliability value is based on the quantity of survivor path values at the second defined index sharing a common value.

16. The storage unit of claim 15, further comprising:
an erasure flag generator that is configured to generate an erasure flag when either the first or the second survivor path reliability value is smaller than the first defined threshold, wherein the generated erasure flag marks the survivor path values at the first and the second defined indices for deletion.

17. The storage unit of claim 15, further comprising:
an erasure flag generator that is configured to generate an erasure flag when the second survivor path reliability value is smaller than a second defined threshold, wherein the generated erasure flag marks the survivor path values at the second defined index for deletion and the first defined threshold is not equal to the second defined threshold.

18. The storage unit of claim 15, further comprising:
an erasure flag generator that is configured to generate an erasure flag when both the first and second survivor path reliability values are smaller than the first defined threshold, wherein the generated erasure flag marks the survivor path values at the first and the second defined indices for deletion.

19. The method of claim 1, further comprising:
generating an erasure flag for a respective survivor path based upon the comparing step determining that the respective survivor path is not converging enough.

20. The storage unit of claim 10, wherein the register is configured to generate an erasure flag for a respective survivor path based upon the comparison determining that the respective survivor path is not converging enough.

* * * * *